(12) United States Patent
Park et al.

(10) Patent No.: US 8,809,865 B2
(45) Date of Patent: Aug. 19, 2014

(54) DISPLAY DEVICE

(71) Applicant: Samsung Display Co., Ltd., Yongin (KR)

(72) Inventors: Je Hyeong Park, Hwaseong-si (KR); Jae-Hwa Park, Gumi-si (KR); Swae-Hyun Kim, Asan-si (KR); Yeun Tae Kim, Suwon-si (KR); Sunghwan Won, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/799,904

(22) Filed: Mar. 13, 2013

(65) Prior Publication Data

US 2014/0117385 A1 May 1, 2014

(30) Foreign Application Priority Data

Oct. 26, 2012 (KR) .................... 10-2012-0119715

(51) Int. Cl.
*H01L 27/14* (2006.01)
*H01L 33/38* (2010.01)
*H01L 33/00* (2010.01)

(52) U.S. Cl.
CPC .......... *H01L 33/387* (2013.01); *H01L 33/0041* (2013.01)
USPC ............................................. 257/72; 257/59

(58) Field of Classification Search
CPC .. H01L 51/5265; H01L 27/1214; H01L 27/12
USPC .................................................. 257/59, 72
See application file for complete search history.

(56) References Cited

U.S. PATENT DOCUMENTS

| | | | |
|---|---|---|---|
| 8,242,692 B2* | 8/2012 | Kim et al. | 313/507 |
| 2002/0067322 A1* | 6/2002 | Yanagawa et al. | 345/87 |
| 2003/0133059 A1 | 7/2003 | Wei et al. | |
| 2005/0247936 A1* | 11/2005 | Bae et al. | 257/59 |
| 2005/0264749 A1 | 12/2005 | Lee | |
| 2007/0222934 A1 | 9/2007 | Huang et al. | |
| 2009/0184946 A1* | 7/2009 | Ahn et al. | 345/206 |
| 2010/0200861 A1* | 8/2010 | Lee et al. | 257/72 |
| 2012/0119235 A1* | 5/2012 | Nishiyama et al. | 257/88 |
| 2013/0113766 A1* | 5/2013 | Kim et al. | 345/205 |
| 2013/0334543 A1* | 12/2013 | Kim et al. | 257/79 |
| 2014/0055440 A1* | 2/2014 | Cho et al. | 345/212 |

FOREIGN PATENT DOCUMENTS

| | | |
|---|---|---|
| KR | 10-2006-0078072 | 7/2006 |
| KR | 10-2006-0131196 | 12/2006 |
| KR | 10-2007-0032173 | 3/2007 |
| KR | 10-2007-0078178 | 7/2007 |

(Continued)

*Primary Examiner* — Bilkis Jahan
(74) *Attorney, Agent, or Firm* — H.C. Park & Associates, PLC

(57) ABSTRACT

A display device including a base substrate, a pixel disposed on the base substrate, and a color filter part disposed between the base substrate and the pixel. The color filter part includes a color filter corresponding to the pixel and a black matrix disposed at at least a side of the color filter. The pixel includes a cover layer defining a tunnel-shaped cavity on the base substrate, an image display part disposed in the tunnel-shaped cavity, and first and second pixel electrodes and a common electrode applying an electric field to the image display part. The tunnel-shaped cavity is formed by forming a sacrificial layer and wet-etching the sacrificial layer.

18 Claims, 10 Drawing Sheets

(56) References Cited

FOREIGN PATENT DOCUMENTS

| KR | 10-0755554 | 8/2007 |
| KR | 10-2007-0099119 | 10/2007 |
| KR | 10-2007-0099228 | 10/2007 |
| KR | 10-2008-0001774 | 1/2008 |
| KR | 10-2008-0028035 | 3/2008 |
| KR | 10-2012-0026880 | 3/2012 |
| KR | 10-2012-0028056 | 3/2012 |
| KR | 10-2013-0010677 | 1/2013 |
| KR | 10-2013-0014957 | 2/2013 |

* cited by examiner

DISPLAY DEVICE

CROSS-REFERENCE TO RELATED APPLICATION

This application claims priority from and the benefit of Korean Patent Application No. 10-2012-0119715, filed on Oct. 26, 2012, which is hereby incorporated by reference for all purposes as if fully set forth herein.

BACKGROUND

1. Field

Exemplary embodiments of the present invention relate to a display device and a method of manufacturing the display device.

2. Discussion of the Background

In recent years, various display devices, such as a liquid crystal display device, an electrophoretic display device, etc., have been widely used instead of a cathode ray tube.

The display device includes two substrates facing each other and an image display unit interposed between the two substrates, e.g., a liquid crystal layer, an electrophoretic layer, etc. The two substrates are coupled to each other while facing each other and spaced a distance apart from each other to allow the image display unit to be disposed therebetween.

To manufacture the display device, a spacer is formed on one of the two substrates to maintain the distance between the two substrates, and the other one of the two substrates is attached to the spacer using an adhesive.

As a result, a manufacturing process of the display device is complicated and a manufacturing cost of the display device is increased.

SUMMARY

Exemplary embodiments of the present invention provide a display device capable of improving a display quality thereof.

Exemplary embodiments of the present invention also provide a method of manufacturing the display device.

Additional features of the invention will be set forth in the description which follows, and in part will be apparent from the description, or may be learned by practice of the invention.

An exemplary embodiment of the present invention discloses a display device including a base substrate, a cover layer disposed on the base substrate to define a tunnel-shaped cavity, an image display part provided in the tunnel-shaped cavity, and an electronic device that controls the image display part.

The electronic device may include a pixel electrode, a common electrode spaced apart from the pixel electrode to form an electric field in the image display part in cooperation with the pixel electrode, thin film transistors that apply a voltage to the pixel electrode, and a reference line connected to a part of the thin film transistors and to which a reference voltage is applied.

A portion of the common electrode and the reference line may be disposed on a same layer and the portion of the common electrode may be spaced apart from the reference line.

An exemplary embodiment of the present invention also discloses a method of manufacturing a display device including forming a pixel electrode and a reference line on a base substrate, forming a main sacrificial layer and a sub-sacrificial layer on the pixel electrode and the reference line is extended in a first direction, forming a common electrode on the main sacrificial layer and the sub-sacrificial layer in a second direction crossing the first direction, forming a cover layer to cover the common electrode, etching the main sacrificial layer and the sub-sacrificial layer to define a tunnel-shaped cavity and a dummy space between the pixel electrode and the common electrode, forming an image display part in the tunnel-shaped cavity and the dummy space, and forming an insulating layer to cover the common electrode and seal the tunnel-shaped cavity.

An exemplary embodiment of the present invention also discloses a method of manufacturing a display device, including forming a first pixel electrode, a second pixel electrode, and a reference line on a base substrate, forming a main sacrificial layer and a sub-sacrificial layer on the first and second pixel electrodes and the reference line is extended in a first direction, forming a common electrode on the main sacrificial layer and the sub-sacrificial layer in a second direction crossing the first direction, forming a cover layer to cover the common electrode, etching the main sacrificial layer to define a tunnel-shaped cavity between the first pixel electrode and the common electrode and between the second pixel electrode and the common electrode, forming an image display part in the tunnel-shaped cavity, and forming an insulating layer to cover the common electrode and seal the tunnel-shaped cavity.

An exemplary embodiment of the present invention also discloses a method of manufacturing a display device, including forming a first pixel electrode, a second pixel electrode, and a reference line on a base substrate, forming a sacrificial layer on the first and second pixel electrodes and the reference line is extended in a first direction, forming a common electrode on the sacrificial layer in a second direction crossing the first direction, forming a cover layer to cover the common electrode, etching the sacrificial layer to define a tunnel-shaped cavity between the first pixel electrode and the common electrode and between the second pixel electrode and the common electrode, forming an image display part in the tunnel-shaped cavity, and forming an insulating layer to cover the common electrode and seal the tunnel-shaped cavity.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
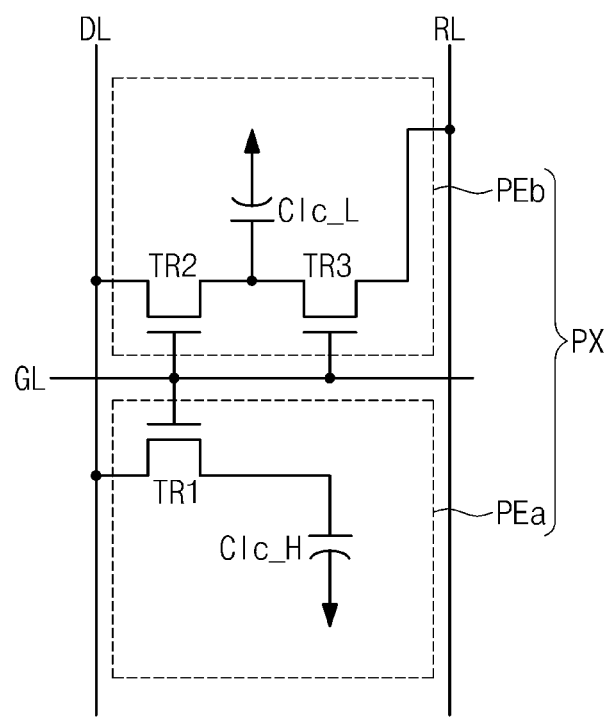
FIG. 1 is an equivalent circuit diagram showing one pixel of a display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, or directly coupled to the other element or layer, or intervening elements or layers may be present. In contrast, when an element or layer is referred to as being "directly on," "directly connected to," or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc., may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

FIG. 1 is an equivalent circuit diagram showing one pixel of a display device according to an exemplary embodiment of the present invention. The display device includes a plurality of pixels, but the pixels have the same configuration and function. Thus, hereinafter only one pixel will be described in detail as a representative example.

Referring to FIG. 1, each pixel PX includes a line part including a gate line GL, a data line DL, and a reference line RL, and first and second sub-pixels PEa and PEb connected to the line part. The first sub-pixel PEa includes a first thin film transistor TR1 and a first liquid crystal capacitor Clc_H, and the second sub-pixel PEb includes a second thin film transistor TR2, a second liquid crystal capacitor Clc_L, and a third thin film transistor TR3. The first and second sub-pixels PEa and PEb are adjacent to each other while the gate line GL is interposed therebetween. In addition, the first thin film transistor TR1 of the first sub-pixel PEa is connected to the data line DL and the gate line GL, and the second thin film transistor TR2 is connected to the data line DL and the gate line GL. In detail, the first thin film transistor TR1 includes a first source connected to the data line DL, a first gate electrode connected to the gate line GL, and a first drain electrode connected to the first liquid crystal capacitor Clc_H. The second thin film transistor TR2 includes a second source connected to the data line DL, a second gate electrode connected to the gate line GL, and a second drain electrode connected to the second liquid crystal capacitor Clc_L.

When a gate signal is applied to the gate line GL, the first, second, and third thin film transistors TR1, TR2, and TR3 are substantially simultaneously turned on. A data voltage applied to the data line DL is applied to the first and second liquid crystal capacitors Clc_H and Clc_L through the turned-on first and second thin film transistors TR1 and TR2.

The third thin film transistor TR3 includes a third source electrode connected to the second drain electrode, a third gate electrode connected to the gate line GL, and a third drain electrode connected to the reference line RL. A reference voltage is applied to the reference line RL. The voltage applied to the second liquid crystal capacitor Clc_L is voltage divided by the third thin film transistor TR3 connected to the second thin film transistor TR2 in series. Accordingly, the second liquid crystal capacitor Clc_L is charged with a pixel voltage lower than a pixel voltage charged in the first liquid crystal capacitor Clc_H.

As a result, an electric field applied to the liquid crystal molecules in an area corresponding to the first sub-pixel PEa is different from an electric field applied to liquid crystal molecules in an area corresponding to the second sub-pixel PEb, and thus the liquid crystal molecules in the area corresponding to the first sub-pixel PEa are have an inclination which differs from the liquid crystal molecules in the area corresponding to the second sub-pixel PEb. Thus, the liquid crystal molecules have different inclination angles in these areas such that a phase delay of a light passing through the liquid crystal molecules is compensated, thereby improving a side visibility.

The voltages respectively applied to the first and second sub-pixels PEa and PEb are swung with respect to a common voltage. When the reference voltage is applied to the thin film transistor TR3 through the reference line RL, the voltage applied to the second sub-pixel PEb may be increased and a difference between an optimal common voltage of the first sub-pixel PEa and an optimal common voltage of the second sub-pixel PEb may be reduced. Therefore, an afterimage and a flicker may be prevented from occurring in the first and second sub-pixels PEa and PEb, which are caused by a distortion of the common voltage, to thereby improve visibility.

The reference voltage may be swung in opposite directions. When the reference voltage is swung, a level of the voltage applied to the second sub-pixel PEb is increased during a positive period of the reference voltage and decreased during a negative period of the reference voltage, so that a transmittance of the liquid crystal molecules may be enhanced. Further, because the reference voltage is swung to a greater degree than the common voltage, a kickback voltage of the second sub-pixel PEb may be reduced, and occurrence of an afterimage, which is caused by the occurrence of the flicker and the distortion of the common voltage, may be prevented.

Figure 2:
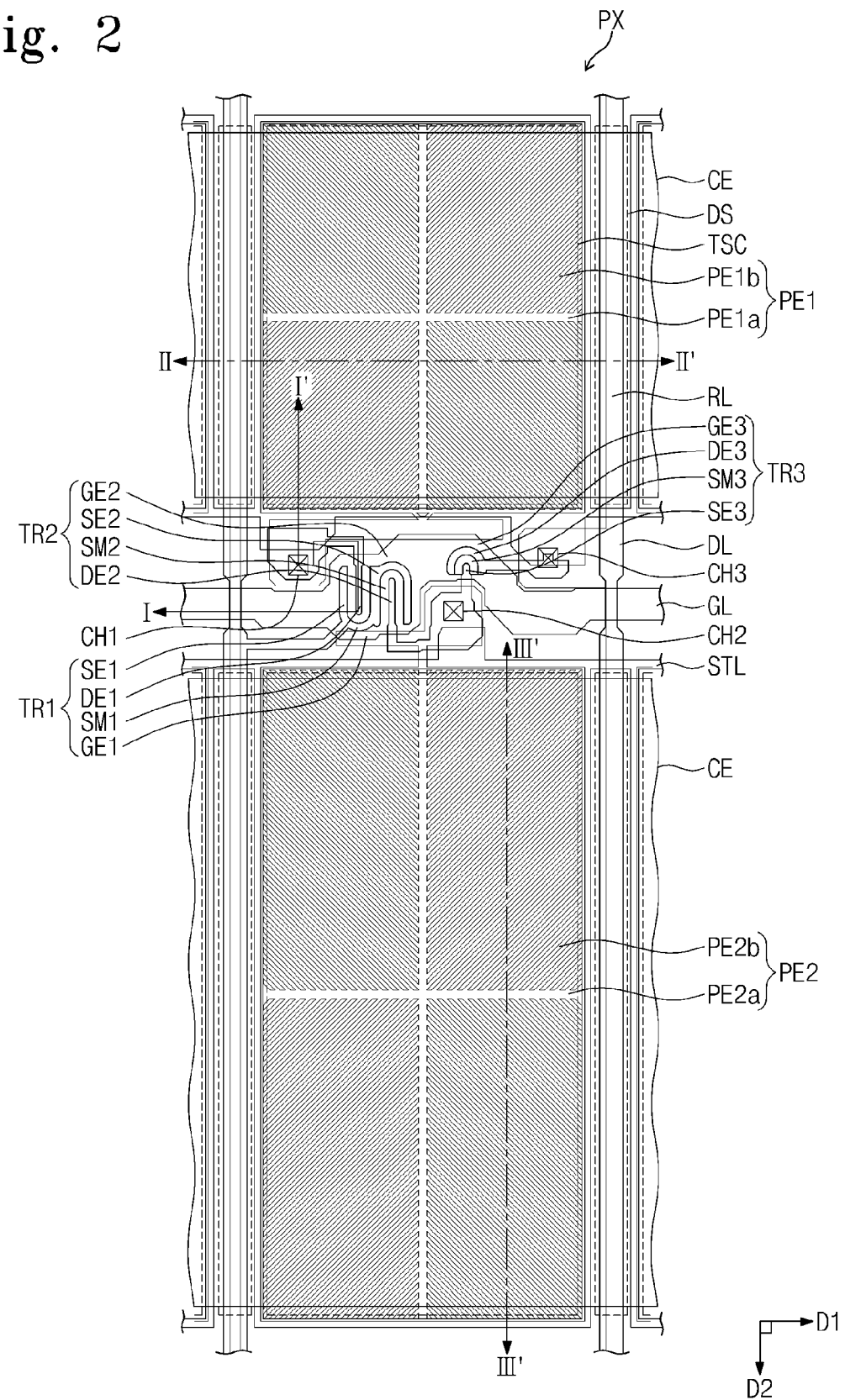
FIG. 2 is a plan view showing a display device according to an exemplary embodiment of the present invention.
Figure 3A:
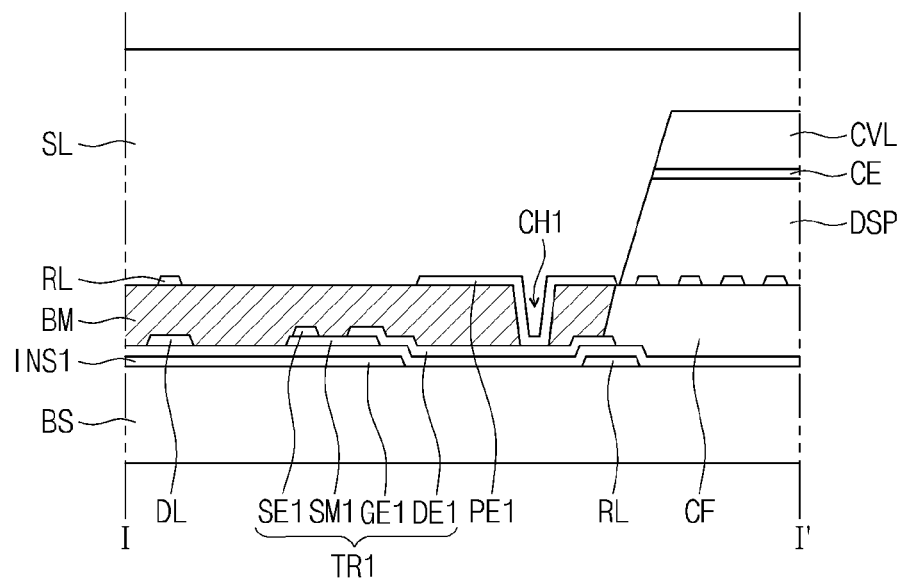
FIG. 3A is a cross-sectional view taken along a line I-I' of FIG. 2.
Figure 3B:
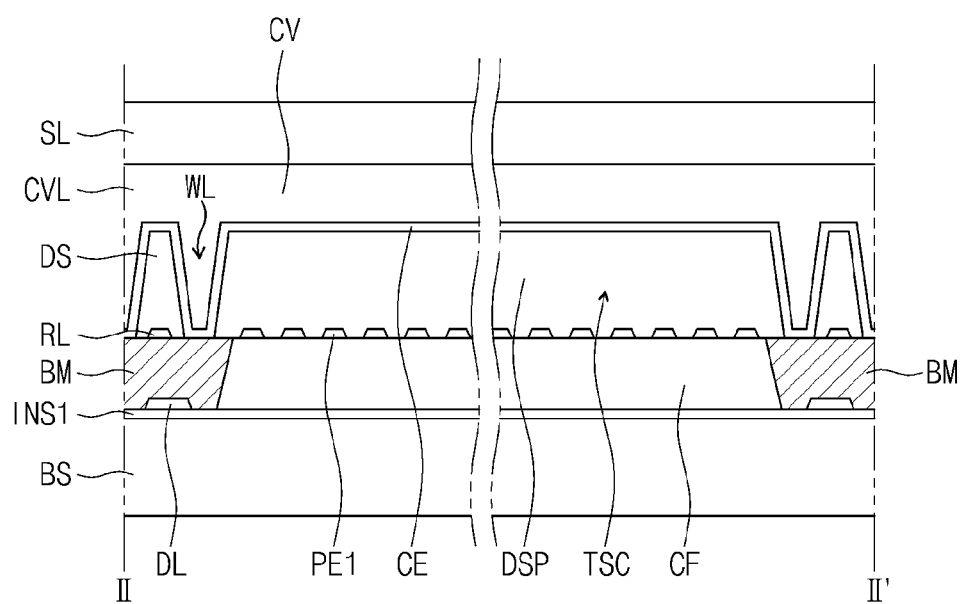
FIG. 3B is a cross-sectional view taken along a line II-II' of FIG. 2.
Figure 3C:
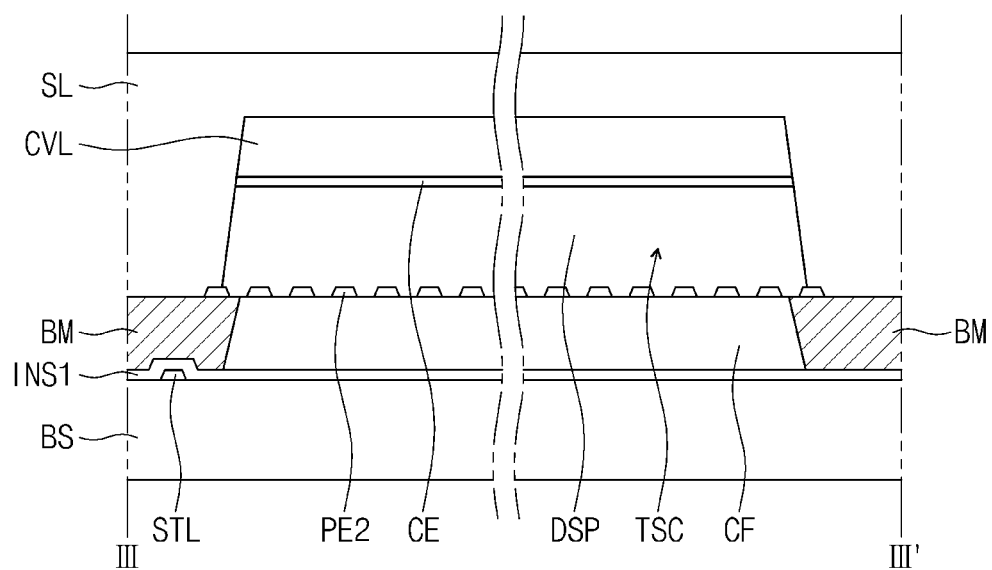
FIG. 3C is a cross-sectional view taken along a line III-III' of FIG. 2.

FIG. 2 is a plan view showing a display device according to an exemplary embodiment of the present invention. FIG. 3A is a cross-sectional view taken along a line I-I' of FIG. 2, FIG. 3B is a cross-sectional view taken along a line II-II' of FIG. 2, and FIG. 3C is a cross-sectional view taken along a line III-III' of FIG. 2.

The display device according to the present exemplary embodiment includes the pixels arranged in a matrix form. Because the pixels have the same configuration and function, for the convenience of explanation, hereinafter, only one pixel will be described in detail. FIGS. 2 and 3A-3C show only one pixel and lines adjacent to the pixel. Here, the pixel has a rectangular shape elongated in one direction, but the shape of the pixel should not be limited to the rectangular shape. That is, the pixel may have various shapes, such as a V shape, a Z shape, etc., when viewed in a plan view.

Referring to FIGS. 1, 2, and 3A-3C, the display device may include a base substrate BS and the pixels PX disposed on the base substrate BS.

The base substrate BS may be a transparent or non-transparent insulating substrate, e.g., a silicon substrate, a glass substrate, a plastic substrate, etc. The gate line GL, the data line DL, a storage line STL, and the reference line RL are disposed on the base substrate BS.

The gate line GL is disposed on the base substrate BS and extended in the first direction D1. The data line DL is extended in a second direction D1 crossing the first direction D1 while interposing an insulating layer INS1 therebetween. The storage line STL is disposed on the base substrate BS and spaced apart from the gate line GL. The storage line STL is extended in the direction in which the gate line GL is extended and further includes branch electrodes branched therefrom in the direction in which the data line DL is extended to surround first and second pixel electrodes PE1 and PE2. The reference line RL is extended in the same direction as the direction in which the data line DL is extended and the reference line RL is overlapped with the data line DL when viewed in a plan view. The voltage applied to the reference line RL is the same level as the voltage applied to the storage line STL.

Each pixel PXL includes the first to third thin film transistors TR1 to TR3 and a pixel electrode including the first and second pixel electrodes PE1 and PE2 connected to the thin film transistors TR1 to TR3. In detail, each pixel includes the first and second sub-pixels. The first sub-pixel includes the first thin film transistor TR1 and the first pixel electrode PE1, and the second sub-pixel includes the second thin film transistor TR2, the third thin film transistor TR3, and the second pixel electrode PE2. The first and second sub-pixels are disposed adjacent to each other while the gate line GL is interposed therebetween.

The first thin film transistor TR1 of the first sub-pixel is connected to the data line DL and the gate line GL. A portion of the gate line GL forms the first gate electrode GE1 of the first thin film transistor TR1, and the first source electrode SE1 is branched from the data line DL. The first drain electrode DE1 is spaced apart from the first source electrode SE1 while a first semiconductor layer SM1 is interposed therebetween, and a portion thereof is overlapped with the first gate electrode GE1.

A portion of the gate line GL forms the second gate electrode GE2 of the second thin film transistor TR2, and the second source electrode SE2 of the second thin film transistor TR2 is branched from the data line DL. The second drain electrode DE2 of the second thin film transistor TR2 is spaced apart from the second source electrode SE2 while a second semiconductor layer SM2 is interposed therebetween, and a portion thereof is overlapped with the second gate electrode GE2.

A portion of the gate line GL forms the third gate electrode GE3 of the third thin film transistor TR3, and the third source electrode SE3 of the third thin film transistor TR3 is extended from the second drain electrode DE.

A color filter part is disposed on the first to third thin film transistors TR1 to TR3. The color filter part includes a color filters CF and a black matrix BM.

The color filters CF allow the light passing through each pixel to have color. The color filters CF include a red color filter, a green color filter, and a blue color filter. The red, green, and blue color filters are arranged to correspond to the pixels in one-to-one correspondence. In addition, the color filters CF may further include a white color filter, a cyan color filter, a magenta color filter, a yellow color filter, etc. The color filters CF may be arranged to allow adjacent pixels to each other to have different colors. Although not shown in the figures, the color filters CF adjacent to each other may be partially overlapped with each other in a boundary portion between the pixels.

The black matrix BM is disposed in a non-display area to block the light not needed to display the image. The black matrix BM prevents light leakage from occurring at the edge of the image display part, which is caused by abnormal operation of the liquid crystal molecules, or colors from being mixed with each other, which occurs at the edge of the pixels as a result of the overlap of the color filters CF. The black matrix BM is provided at a side of each color filter CF, and may surround each color filter CF. Although not shown in the figures, the color filter CF and the black matrix BM are overlapped with each other in an area adjacent to the boundary portion of the pixels.

Each color filter CF of the color filter part and the black matrix BM may be individually provided, but they may also be formed in layer after being individually formed. Accordingly, hereinafter the color filter part will be handled in one layer.

The black matrix BM includes a first contact hole CH1 to expose a portion of the first drain electrode DE1 of the first thin film transistor TR1, a second contact hole CH2 to expose a portion of the second drain electrode DE2 of the second thin film transistor TR2, and a third contact hole CH3 to expose a portion of the third drain electrode DE3 of the third thin film transistor TR3. In the present exemplary embodiment, the first to third contact holes CH1 to CH3 are formed by partially removing the black matrix BM, but they should not be so limited. That is, the first to third contact holes CH1 to CH3 may be formed by partially removing the color filters CF.

The first pixel electrode PE1 is connected to the first drain electrode DE1 through the first contact hole CH1. The first pixel electrode PE1 includes a trunk portion PE1a and a plurality of branch portions PE1b extended from the trunk portion PE1a. The branch portions PE1b are extended to the area in which the storage line STL is formed. The first pixel electrode PE1 is partially overlapped with the storage line STL and the branch electrode to form a storage capacitor.

The second pixel electrode PE2 is connected to the second drain electrode DE2 through the second contact hole CH2. The second pixel electrode PE2 includes a trunk portion PE2a and a plurality of branch portions PE2b extended from the trunk portion PE2a. The branch portions PE2b are extended to the area in which the storage line STL is formed. The second pixel electrode PE2 is partially overlapped with the storage line STL and the branch electrode to form a storage capacitor.

The reference lint RL is connected to the third drain electrode DE3 of the third thin film transistor TR3 through the third contact hole CH3. The reference line RL serves as a shielding electrode to shield the data line DL. The reference line RL is spaced apart from the first pixel electrode PE1 and the second pixel electrode PE2 when viewed in a plan view.

The first and second pixel electrodes PE1 and PE2 may be formed of the same material and disposed on the same layer, i.e., the color filter part. In addition, the reference line RL may be formed from the same layer as the first and second pixel electrodes PE1 and PE2 through a single photolithography process using one mask.

Although not shown in the figures, a protective layer is provided between the color filter part and the first to third thin film transistors TR1 to TR3 to protect a channel portion of the thin film transistors TR1 to TR3.

A cover layer CVL is disposed on the first and second pixel electrodes PE1 and PE2 to define a tunnel-shaped cavity (TSC) and a dummy space DS on the base substrate BS. In the present exemplary embodiment, the image display part DSP is disposed in the tunnel-shaped cavity TSC and the dummy space DS.

The image display part DSP displays an image in accordance with an electric field and should not be limited to a specific material as long as the material is in a liquid state. For instance, the image display part DSP may be an electrophoretic layer or a liquid crystal layer. The liquid crystal layer includes liquid crystal molecules having an optical anisotropy. The liquid crystal molecules are driven by the electric field to transmit or block the light passing through the liquid crystal layer, thereby displaying a desired image. Hereinafter, the liquid crystal layer will be described as the image display part DSP unless a separate explanation has been provided otherwise.

The cover layer CVL is extended in the first direction D1 on the first and second pixel electrodes PE1 and PE2. The cover layer CVL is formed to be extended in the first direction D1 in the area in which the image display part DSP is formed, i.e., the area in which the first and second pixel electrodes PE1 and PE2 are formed. However, the cover layer CVL is not formed in the area in which the gate line GL and the first to third thin film transistors TR1 to TR3 are formed among the area in which the first and second pixel electrodes PE1 and PE2 are not formed and the area corresponding to the reference line RL disposed adjacent to the first to third thin film transistors TR1 to TR3. That is, the cover layer CVL is not formed between the first and second pixel electrodes PE1 and PE2 adjacent to each other.

The cover layer CVL includes a sidewall portion WL protruded from an upper surface of the base substrate BS to surround the tunnel-shaped cavity TSC and a cover portion CV connected to the sidewall portion WL to cover the tunnel-shaped cavity TSC and the dummy space DS. In other words, the cover portion CV is spaced apart from an upper surface of the color filter part and the first and second pixel electrodes PE1 and PE2 so as to define the tunnel-shaped cavity TSC in cooperation with the color filter part. The sidewall portion WL of the cover layer CVL, which defines the tunnel-shaped cavity TSC and the dummy space DS, is disposed between the area in which the reference line RL is formed and the area in which the first and second pixel electrodes PE1 and PE2 are formed. In addition, the cover portion CV is spaced apart from the upper surface of the color filter part and the reference line RL to define the dummy space DS in cooperation with the color filter part. The dummy space DS is provided to correspond to a portion of the area of the pixel in which the image is not displayed, and disposed between the first pixel electrodes PE1 of the pixels adjacent to each other, i.e., a side of the tunnel-shaped cavity TSC. In FIG. 2, the areas in which the tunnel-shaped cavity TSC and the dummy space DS are defined have been represented by dotted lines.

The tunnel-shaped cavity TSC and the dummy space DS are extended in the second direction D2. Both end portions of the tunnel-shaped cavity TSC and the dummy space DS, that is, an end portion of the tunnel-shaped cavity TSC in the second direction D2 and an end portion of the tunnel-shaped cavity TSC in an opposite direction to the second direction D2 are opened because the cover layer CVL is not formed at both end portions of the tunnel-shaped cavity TSC. In addition, an end portion of the dummy space DS in the second direction D2 and an end portion of the dummy space DS in an opposite direction to the second direction D2 are opened because the cover layer CVL is not formed at both end portions of the tunnel-shaped cavity TSC. However, the direction in which the cover layer CVL is formed should not be limited thereby or thereby, and the cover layer CVL may be extended along different directions from the second direction D2.

The common electrode CE is provided along a lower surface of the cover layer CVL, i.e., the lower surface of the sidewall portion WL and the cover portion CV, and extended in the direction in which the cover layer CVL is extended. The common voltage is applied to electrode CE. The common voltage may have a voltage level different from that of the reference voltage. As an example, the common voltage is about 7 volts and the reference voltage is in a range from about 8 volts to about 11 volts.

The common electrode CE is extended in the direction in which the cover layer CVL is extended, i.e., the first direction D1, and shared by the pixels adjacent to each other in the first direction D1. Accordingly, the common electrode CE is positioned between the sidewall portion WL and the color filter part in the area at which the sidewall portion WL meets the color filter part, and directly makes contact with the sidewall portion WL and the color filter part.

The image display part DSP, i.e., the liquid crystal layer, is provided in the tunnel-shaped cavity TSC. The image display part DSP in the tunnel-shaped cavity TSC is disposed between the first pixel electrode PE1 and the common electrode CE and between the second pixel electrode PE2 and the common electrode CE. The image display part DSP is controlled by the electric field generated between the first pixel electrode PE1 and the common electrode CE, and between the second pixel electrode PE2 and the common electrode CE, thereby displaying the image. A dummy liquid crystal layer is provided in the dummy space DS. The dummy liquid crystal layer is controlled by an electric field generated by the voltages respectively applied to the common electrode CE and the reference line RL and always displays a black color. In addition, because the dummy space DS corresponds to the area in which the black matrix BM is provided, the dummy space DS may always display the black color regardless of the display of the image display part DSP.

The sidewall portion WL of the cover layer CVL is spaced apart from the reference line RL such that the common electrode CE does not make contact with the reference line RL. In detail, the sidewall portion WL of the cover layer CVL is spaced apart from the reference line RL by about 3 micrometers or more when viewed in a plan view. Thus, the possibility of a short circuit between the common electrode CE and the reference line RL may be prevented.

In addition, the sidewall portion WL is spaced apart from the first and second pixel electrodes PE1 and PE2 such that the first pixel electrode PE1 does not make contact with the second pixel electrode PE2. For instance, the sidewall WL is spaced apart from each of the first and second pixel electrodes PE1 and PE2 by about 3 micrometers or more when viewed in a plan view.

A sealant layer SL is disposed on the cover layer CVL. The sealant layer SL seals both end portions of the tunnel-shaped cavity TSC to seal the tunnel-shaped cavity TSC. That is, the tunnel-shaped cavity TSC is sealed by the color filter part, the first pixel electrode PE1, the common electrode CE, and the sealant layer SL or by the color filter part, the second pixel electrode PE2, the common electrode CE, and the sealant layer SL. In addition, the sealant layer SL seals both end portions of the dummy space DS to seal the dummy space DS. That is, the dummy space DS is sealed by the reference line RL, the color filter part, the common electrode CE, and the sealant layer SL.

Although not shown in figures, when the image display part DSP is the liquid crystal layer, a polarization plate (not shown) is disposed on each of a rear surface of the base substrate BS and the sealant layer SL. When the polarization plate disposed on the rear surface of the base substrate BS and the polarization plate disposed on the sealant layer SL are respectively referred to as first and second polarization plates, the light passing through the first polarization plate is vertically polarized with respect to the light passing through the second polarization plate.

In the display device according to the present exemplary embodiment, the gate signal is applied to the thin film transistors through the gate line GL, and the data signal is applied to the thin film transistors TR1-TR3 through the data line DL. Therefore, an image signal is applied to the first and second pixel electrodes PE1 and PE2 through the turned-on thin film transistors TR1-TR3, and the electric field is generated between the common electrode CE, to which is applied the common voltage, and the first and second pixel electrodes PE1 and PE2. The liquid crystal molecules are driven by the electric field, and thus the image corresponding to an amount of the light passing through the liquid crystal layer is displayed.

In addition, the common electrode CE and the reference line RL are disposed on the same layer, but spaced apart from each other. Thus, a short circuit between the common electrode CE and the reference line RL may be prevented, and no additional insulating layer used to insulate the common electrode and the reference line is required.

Hereinafter, a method of manufacturing the display device will be described in detail with reference to FIGS. 2 and 3A to 3C.

The gate line GL, the storage line STL, the data line DL, and the thin film transistors TR1, TR2, and TR3 are formed on the base substrate BS. The gate line GL, the storage line STL, the data line DL, and the thin film transistors TR1, TR2, and TR3 are formed by a photolithography process.

Then, the first and second pixel electrodes PE1 and PE2 connected to the thin film transistors TR1 to TR3 and the reference line RL are formed. The first and second pixel electrodes PE1 and PE2 and the reference line RL may be patterned by a photolithography process using one mask.

A sacrificial layer (not shown) is formed on the pixel electrodes PE1 and PE2 and the reference line RL. The sacrificial layer includes a main sacrificial layer (not shown) to be formed in the area corresponding to the display area in which the image is displayed and a sub-sacrificial layer (not shown) formed in the non-display area except for the display area. The main sacrificial layer and the sub-sacrificial layer are extended in the second direction D2. The main sacrificial layer is removed later to define the tunnel-shaped cavity TSC. To this end, the main sacrificial layer is formed to have width and height corresponding to those of the tunnel-shaped cavity in the area in which the image display part DSP is formed. Thus, the main sacrificial layer is extended in the second direction D2 through the areas in which the first and second pixel electrodes PE1 and PE2 are formed.

The sub-sacrificial layer is formed at a side of the main sacrificial layer and extended in the second direction D2 to cover the reference line RL.

Then, the common electrode CE is formed on the main sacrificial layer and the sub-sacrificial layer along the second direction D2 crossing the first direction D1. The common electrode CE is covered by the cover layer CVL. According to exemplary embodiment, the common electrode CE and the cover layer CVL are overlapped with each other and have the same shape when viewed in a plan view.

The main sacrificial layer and the sub-sacrificial layer are removed by an etch process. The main sacrificial layer and the sub-sacrificial layer are sequentially removed through a portion in which the cover layer CVL is not formed. The main sacrificial layer and the sub-sacrificial layer are removed by a dry etch process using plasma or a wet etch process using etchant.

Then, the image display part DSP, e.g., the liquid crystal layer, is formed in the tunnel-shaped cavity and the dummy space DS. When the liquid crystal is provided around the tunnel-shaped cavity TSC, the liquid crystal moves into the tunnel-shaped cavity by a capillary tube phenomenon because the liquid crystal is a fluid. The liquid crystal may be provided around the tunnel-shaped cavity by an inkjet using a micropipette. In addition, the liquid crystal may be injected into the tunnel-shaped cavity using a vacuum liquid crystal injection device. According to an exemplary embodiment, when a portion of the base substrate BS on which the tunnel-shaped cavity TSC is formed is dipped into a container of a chamber, in which the liquid crystal is contained, and then a pressure of the chamber is lowered, the liquid crystal is provided into the tunnel-shaped cavity TSC by the capillary tube phenomenon.

An alignment layer may be formed in the tunnel-shaped cavity TSC in accordance with a display mode of the display device according to the present exemplary embodiment. The alignment layer may be formed using an alignment solution before the image display part DSP is formed. The alignment solution is obtained by mixing an alignment material, e.g., polyimide, with a solvent. Because the alignment solution is a fluid, the alignment solution may be provided into the tunnel-shaped cavity TSC by the same or similar method as the method used to provide the liquid crystal.

Then, the liquid crystal is removed except for the liquid crystal provided in the tunnel-shaped cavity TSC and the sealant layer SL is formed to surround the tunnel-shaped cavity TSC. The sealant layer SL seals the openings of the tunnel-shaped cavity TSC through which the liquid crystal is injected.

As described above, the structure in which the common electrode is spaced apart from the reference line may be achieved without additional photolithography processes.

Figure 4:
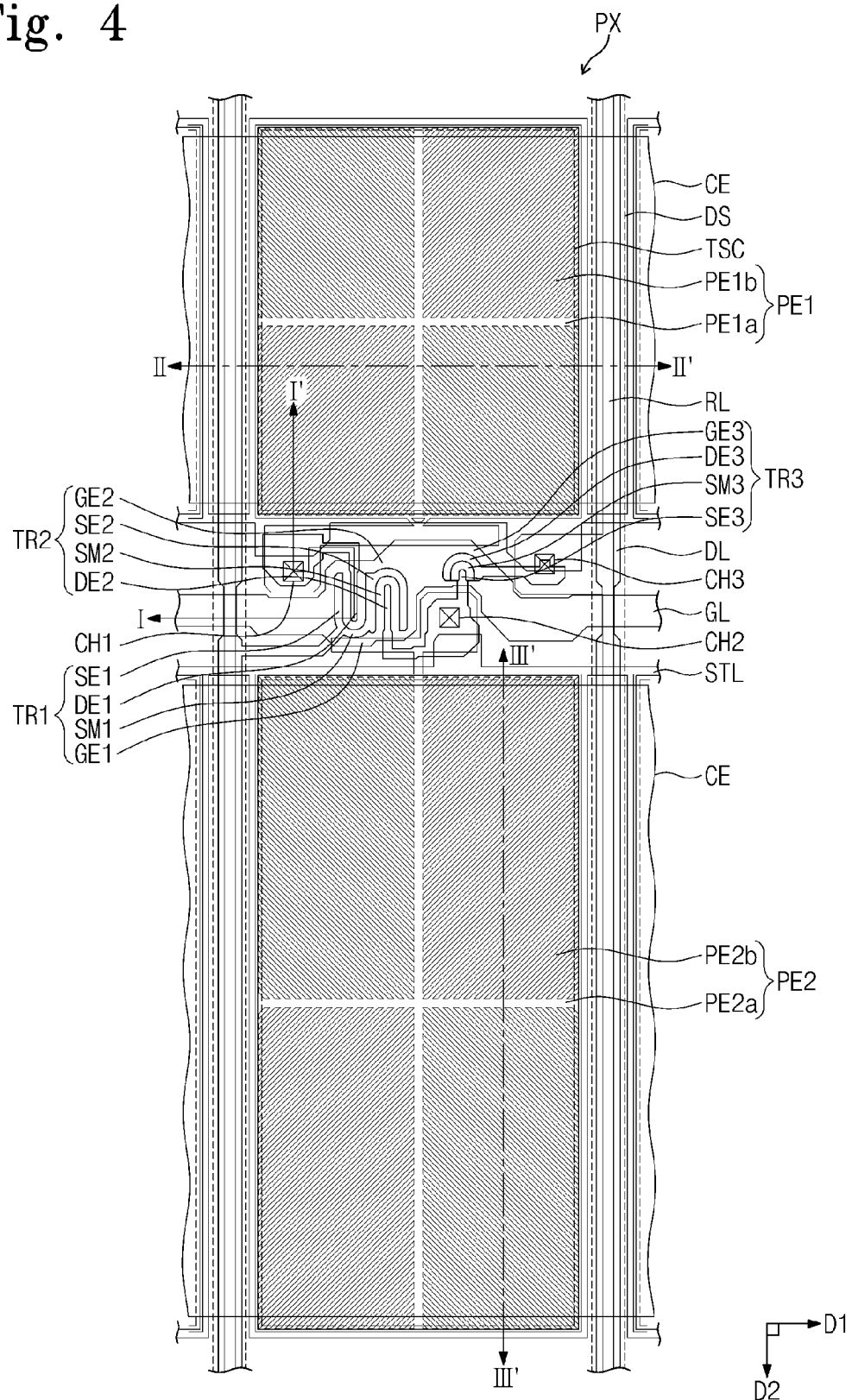
FIG. 4 is a plan view showing a display device according to another exemplary embodiment of the present invention.
Figure 5A:
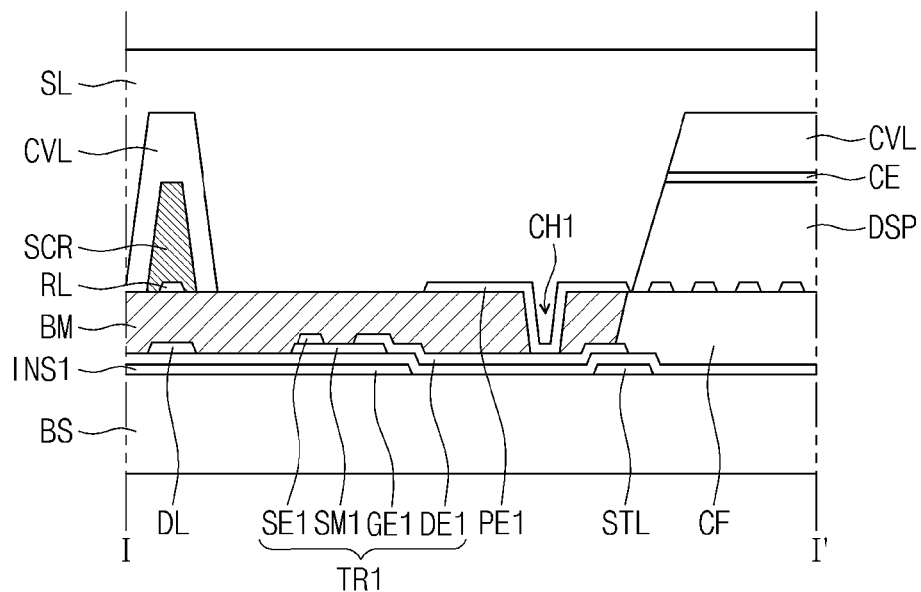
FIG. 5A is a cross-sectional view taken along a line I-I' of FIG. 4.
Figure 5B:
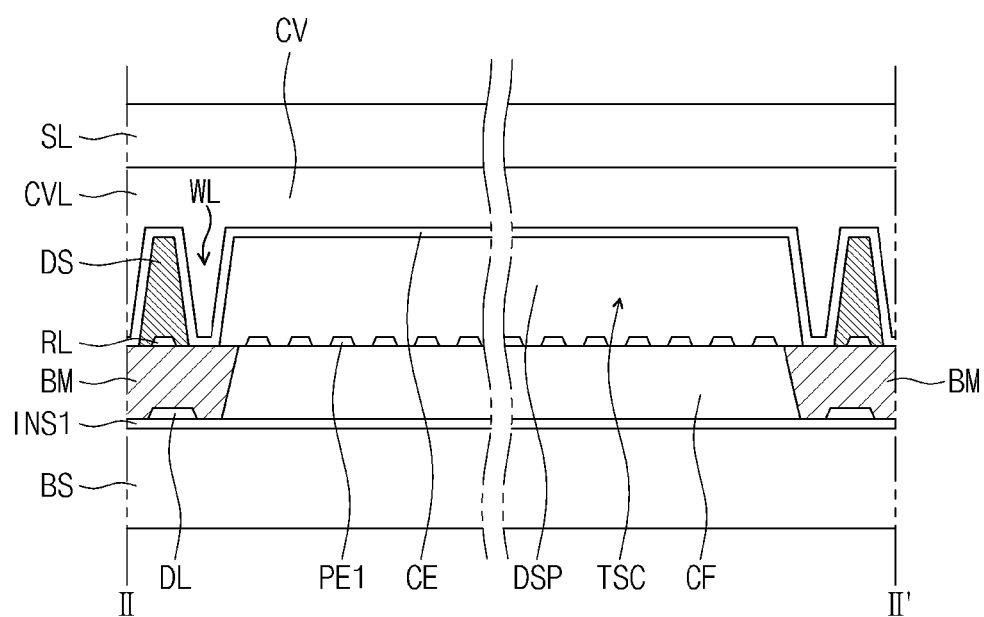
FIG. 5B is a cross-sectional view taken along a line II-II' of FIG. 4.
Figure 5C:
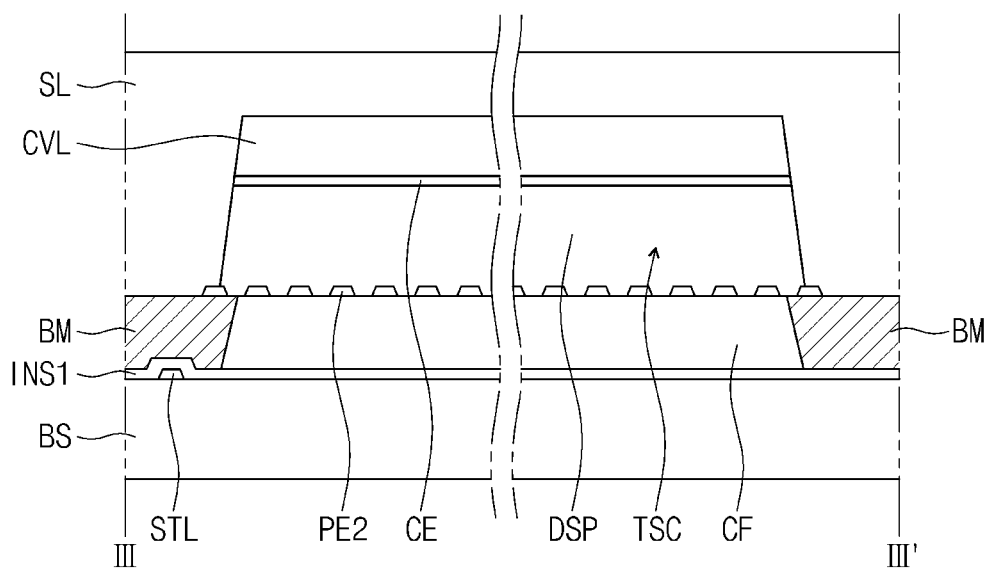
FIG. 5C is a cross-sectional view taken along a line III-III' of FIG. 4.

FIG. 4 is a plan view showing a display device according to another exemplary embodiment of the present disclosure. FIG. 5A is a cross-sectional view taken along a line I-I' of FIG. 4, FIG. 5B is a cross-sectional view taken along a line II-II' of FIG. 4, and FIG. 5C is a cross-sectional view taken along a line III-III' of FIG. 4. In FIGS. 4 and 5A to 5C, the same reference numerals denote the same elements in FIGS. 2 and 3A to 3C, and thus detailed descriptions of the same elements will be omitted.

Referring to FIGS. 4 and 5A to 5C, the display device according to another exemplary embodiment has the same structure and function as those of the display device shown in FIGS. 2 and 3A to 3C except for the cover layer CVL and the image display part DSP.

The cover layer CVL is disposed on the first and second pixel electrodes PE1 and PE2 formed on the base substrate BS to define the tunnel-shaped cavity TSC and the dummy space DS. In the present exemplary embodiment, the image display part is disposed in the tunnel-shaped cavity TSC and a sacrificial layer SCR is disposed in the dummy space DS.

The cover layer CVL is extended in the first direction D1 on the first and second pixel electrodes PE1 and PE2. The cover layer CVL is extended in the first direction D1 passing through the area in which the image display part DSP is formed, i.e., the area in which the first and second pixel electrodes PE1 and PE2 are formed.

However, the cover layer CVL is not formed in the areas in which the gate line GL and the thin film transistors TR1 to TR3 are formed in the area in which the first and second pixel electrodes PE1 and PE2 are not formed. That is, the cover layer CVL is not formed between the first and second pixel electrodes PE1 and PE2 adjacent to each other. In the present exemplary embodiment, however, the cover layer CVL covers the area in which the reference line RL is formed. That is, unlike the embodiment of FIG. 2, the cover layer CVL is disposed on a portion of the reference line RL that is disposed adjacent to the thin film transistors TR1 to TR3.

The cover layer CVL includes a sidewall portion WL protruded from an upper surface of the base substrate BS to surround the tunnel-shaped cavity TSC, and a cover portion CV connected to the sidewall portion WL to cover the tunnel-shaped cavity TSC and the dummy space DS. In other words, the cover portion CV is spaced apart from an upper surface of the color filter part and the first and second pixel electrodes PE1 and PE2 so as to define the tunnel-shaped cavity TSC in cooperation with the color filter part. In addition, the cover portion CV is spaced apart from the upper surface of the color filter part and the reference line RL to define the dummy space DS in cooperation with the color filter part. The dummy space DS is provided to correspond to the area of the pixel, in which the reference line RL is formed, i.e., a side of the tunnel-shaped cavity TSC. In FIG. 4, the areas in which the tunnel-shaped cavity TSC and the dummy space DS are defined have been represented by dotted lines.

The tunnel-shaped cavity TSC and the dummy space DS are extended in the second direction D2. Both end portions of the tunnel-shaped cavity TSC, that is, an end portion of the tunnel-shaped cavity TSC in the second direction D2 and an end portion of the tunnel-shaped cavity TSC in an opposite direction to the second direction D2 are opened because the cover layer CVL is not formed at both end portions of the tunnel-shaped cavity TSC. However, the dummy space DS is provided to cover the entire portion of the reference line RL and there is no area in which the cover layer CVL is not formed, so that the dummy space DS is not opened.

The common electrode CE is provided along a lower surface of the cover layer CVL, i.e., the lower surface of the sidewall portion WL and the cover portion CV, and extended in the direction in which the cover layer CVL is extended. The common voltage is applied to the common electrode CE.

The common electrode CE is extended in the direction in which the cover layer CVL is extended, i.e., the first direction D1, and shared by the pixels adjacent to each other in the first direction D1. Accordingly, the common electrode CE is positioned between the sidewall portion WL and the color filter part in the area at which the sidewall portion WL meets the color filter part, and directly makes contact with the sidewall portion WL and the color filter part.

The image display part DSP, i.e., the liquid crystal layer, is provided in the tunnel-shaped cavity TSC. The image display part DSP in the tunnel-shaped cavity TSC is disposed between the first pixel electrode PE1 and the common electrode CE, and between the second pixel electrode PE2 and the common electrode CE. The image display part DSP is controlled by the electric field generated between the first pixel electrode PE1 and the common electrode CE, and between the second pixel electrode PE2 and the common electrode CE so as to display the image.

A sacrificial layer SCR is provided in the dummy space DS. The sacrificial layer SCR may be an organic insulating material or an inorganic insulating material.

The sidewall portion WL of the cover layer CVL is spaced apart from the reference line RL such that the common electrode CE does not make contact with the reference line RL. In detail, the sidewall portion WL of the cover layer CVL is spaced apart from the reference line RL by about 3 micrometers or more when viewed in a plan view. Thus, a short circuit between the common electrode CE and the reference line RL may be prevented.

In addition, the sidewall portion WL is spaced apart from the first and second pixel electrodes PE1 and PE2 such that the first pixel electrode PE1 does not make contact with the second pixel electrode PE2. For instance, the sidewall WL is spaced apart from each of the first and second pixel electrodes PE1 and PE2 by about 3 micrometers or more when viewed in a plan view.

A sealant layer SL is disposed on the cover layer CVL. The sealant layer SL seals both end portions of the tunnel-shaped cavity TSC to seal the tunnel-shaped cavity TSC. That is, the tunnel-shaped cavity TSC is sealed by the first pixel electrode PE1, the second pixel electrode PE2, the common electrode CE, and the sealant layer SL.

In the display device according to the present exemplary embodiment, the common electrode and the reference line are disposed on the same layer, but spaced apart from each other. Thus, a short circuit between the common electrode and the reference line may be prevented, and no additional insulating layer used to insulate the common electrode and the reference line is required.

Hereinafter, a method of manufacturing the display device according to another exemplary embodiment will be described in detail with reference to FIGS. 4 and 5A to 5C.

The gate line GL, the storage line STL, the data line DL, and the thin film transistors TR1 to TR3 connected to the gate line GL, the storage line STL, the data line DL are formed on the base substrate BS. The gate line GL, the storage line STL, the data line DL, and the thin film transistors TR1 to TR3 are formed by a photolithography process.

Then, the first and second pixel electrodes PE1 and PE2 connected to the thin film transistors TR1 to TR3 and the reference line RL are formed. The first and second pixel electrodes PE1 and PE2 and the reference line RL may be patterned by a photolithography process using one mask.

The sacrificial layer (not shown) is formed on the first and second pixel electrodes PE1 and PE2 and the reference line RL. The sacrificial layer includes a main sacrificial layer (not shown) to be formed in the area corresponding to the display area in which the image is displayed and a sub-sacrificial layer (not shown) formed in the non-display area except for the display area. The main sacrificial layer and the sub-sacrificial layer are extended in the second direction D2.

The main sacrificial layer is removed later to define the tunnel-shaped cavity TSC. The main sacrificial layer is formed to have width and height corresponding to those of the tunnel-shaped cavity TSC in the area in which the image display part DSP is formed. Thus, the main sacrificial layer is extended in the second direction D2 through the areas in which the first and second pixel electrodes PE1 and PE2 are formed.

The sub-sacrificial layer is formed at a side of the main sacrificial layer and extended in the second direction D2 to cover the reference line RL.

Then, the common electrode CE is formed on the main sacrificial layer and the sub-sacrificial layer along the second direction D2 crossing the first direction D1.

The cover layer CVL is formed to cover the common electrode CE. The cover layer CVL covers the main sacrificial layer corresponding to the first and second pixel electrodes PE1 and PE2, but is not formed between the first and second pixel electrodes PE1 and PE2 to expose a portion of the main sacrificial layer. However, the sub-sacrificial layer is entirely covered.

After that, the main sacrificial layer is removed by an etch process, but the sub-sacrificial layer is not etched. The main sacrificial layer is removed through a portion in which the cover layer CVL is not formed. The main sacrificial layer is removed by a dry etch process using plasma or a wet etch process using etchant.

Then, the image display part DSP, e.g., the liquid crystal layer, is formed in the tunnel-shaped cavity. When the liquid crystal is provided around the tunnel-shaped cavity TSC, the liquid crystal moves into the tunnel-shaped cavity TSC by a capillary tube phenomenon because the liquid crystal is a fluid.

An alignment layer may be formed in the tunnel-shaped cavity TSC in accordance with a display mode of the display device according to the present exemplary embodiment.

Then, the liquid crystal is removed except for the liquid crystal provided in the tunnel-shaped cavity TSC and the sealant layer SL is formed to surround the tunnel-shaped cavity TSC. The sealant layer SL seals the openings of the tunnel-shaped cavity TSC, through which the liquid crystal is injected.

As described above, the structure in which the common electrode is spaced apart from the reference line may be achieved without additional photolithography processes.

Figure 6:
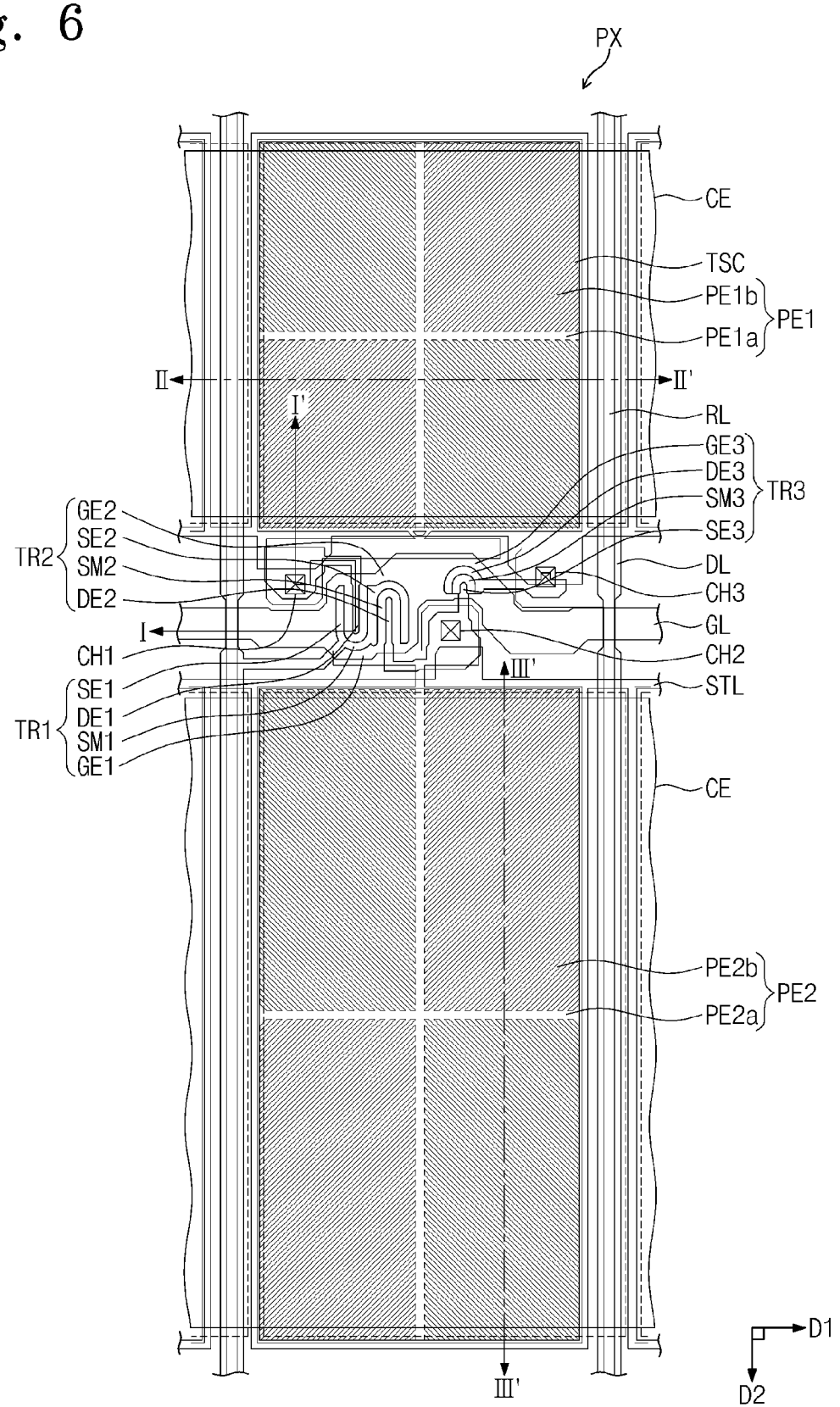
FIG. 6 is a plan view showing a display device according to another exemplary embodiment of the present invention.
Figure 7A:
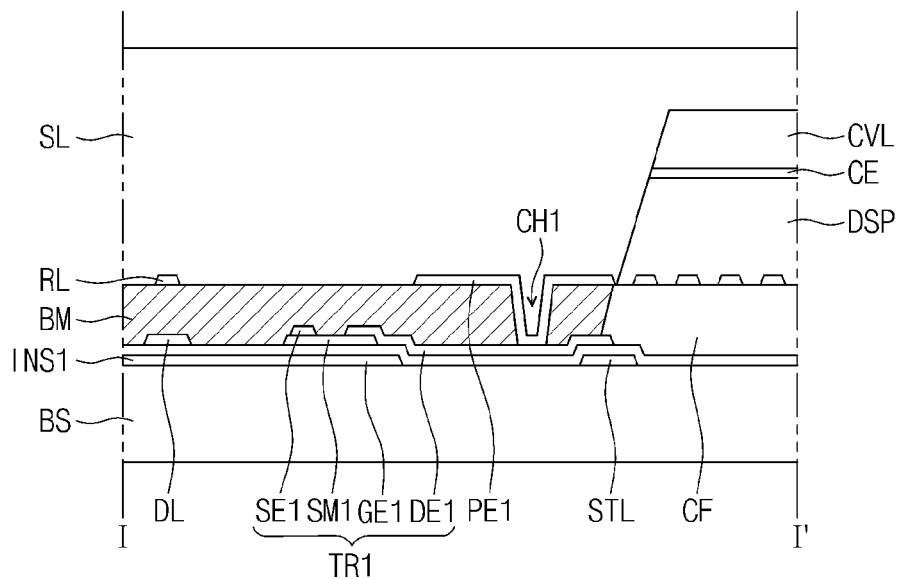
FIG. 7A is a cross-sectional view taken along a line I-I' of FIG. 6.
Figure 7B:
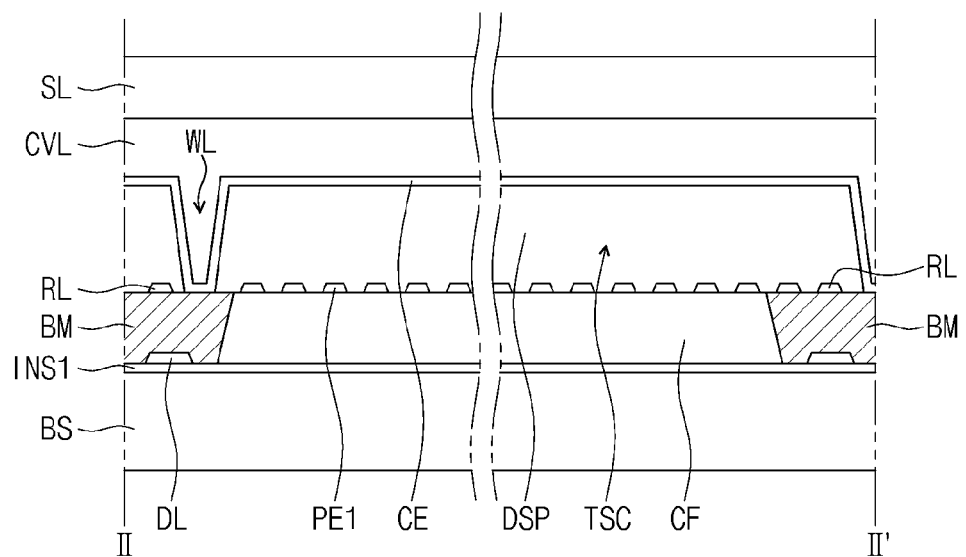
FIG. 7B is a cross-sectional view taken along a line II-II' of FIG. 6.
Figure 7C:
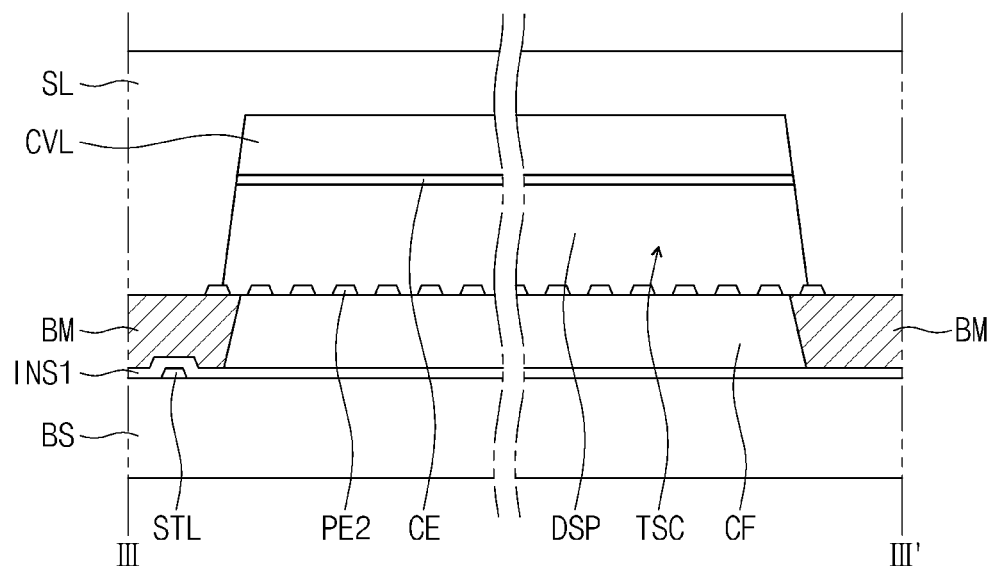
FIG. 7C is a cross-sectional view taken along a line III-III' of FIG. 6.

FIG. 6 is a plan view showing a display device according to another exemplary embodiment of the present invention. FIG. 7A is a cross-sectional view taken along a line I-I' of FIG. 6, FIG. 7B is a cross-sectional view taken along a line II-II' of FIG. 6, and FIG. 7C is a cross-sectional view taken along a line III-III' of FIG. 6. The display device shown in FIGS. 6 and 7A to 7C have the same structure and function as those of the display device shown in FIGS. 2 and 3A to 3C except for the cover layer and the image display part.

Referring to FIGS. 6 and 7A-7C, the cover layer CVL is disposed on the first and second pixel electrodes PE1 and PE2 formed on the base substrate BS to define the tunnel-shaped cavity TSC. In the present exemplary embodiment, the dummy space DS is not provided.

The cover layer CVL is extended in the first direction D1 on the first and second pixel electrodes PE1 and PE2. The cover layer CVL is extended in the first direction D1 passing through the area in which the image display part DSP is formed, i.e., the area in which the first and second pixel electrodes PE1 and PE2 are formed. However, the cover layer CVL is not formed in the areas in which the gate line GL and the thin film transistors TR1 to TR3 are formed in the area in which the first and second pixel electrodes PE1 and PE2 are not formed. That is, the cover layer CVL is not formed between the first and second pixel electrodes PE1 and PE2 adjacent to each other in one pixel.

The cover layer CVL includes a sidewall portion WL protruded from an upper surface of the base substrate BS to surround the tunnel-shaped cavity TSC and a cover portion CV connected to the sidewall portion WL to cover the tunnel-shaped cavity TSC. In other words, the cover portion CV is spaced apart from an upper surface of the color filter part and the first and second pixel electrodes PE1 and PE2 so as to define the tunnel-shaped cavity TSC in cooperation with the color filter part. In the present exemplary embodiment, the tunnel-shaped cavity TSC includes the area in which the first pixel electrode PE1 is formed, a portion of the area in which the reference line RL provided adjacent to the first pixel electrode PE1 is formed, the area in which the second pixel electrode PE2 is formed, and a portion of the area in which the reference line RL provided adjacent to the second pixel electrode PE2 is formed. That is, the tunnel-shaped cavity TSC is defined on the area cover the areas in which the first and second pixel electrodes PE1 and PE2 are formed and the portions of the reference line RL disposed adjacent to the first and second pixel electrodes PE1 and PE2.

The tunnel-shaped cavity TSC is extended in the second direction D2. Both end portions of the tunnel-shaped cavity TSC, that is, an end portion of the tunnel-shaped cavity TSC in the second direction D2 and an end portion of the tunnel-shaped cavity TSC in an opposite direction to the second direction D2 are opened since the cover layer CVL is not formed at both end portions of the tunnel-shaped cavity TSC.

The common electrode CE is provided along a lower surface of the cover layer CVL, i.e., the lower surface of the sidewall portion WL and the cover portion CV, and extended in the direction in which the cover layer CVL is extended. The common voltage is applied to the common electrode CE.

The common electrode CE is extended in the direction in which the cover layer CVL is extended, i.e., the first direction D1, and shared by the pixels adjacent to each other in the first direction D1. Accordingly, the common electrode CE is positioned between the sidewall portion WL and the color filter part in the area at which the sidewall portion WL meets the color filter part, and directly makes contact with the sidewall portion WL and the color filter part.

The image display part DSP, i.e., the liquid crystal layer, is provided in the tunnel-shaped cavity TSC. The image display part DSP in the tunnel-shaped cavity TSC is disposed between the first pixel electrode PE1 and the common electrode CE and between the second pixel electrode PE2 and the common electrode CE. The image display part DSP is controlled by the electric field generated between the first pixel electrode PE1 and the common electrode CE and between the second pixel electrode PE2 and the common electrode CE so as to display the image.

The sidewall portion WL of the cover layer CVL is spaced apart from the reference line RL such that the common electrode CE does not make contact with the reference line RL. In detail, the sidewall portion WL of the cover layer CVL is spaced apart from the reference line RL with about 3 micrometers or more when viewed in a plan view. Thus, a short circuit between the common electrode CE and the reference line RL may be prevented.

In addition, the sidewall portion WL is spaced apart from the pixel electrodes such that the common electrode does not make contact with the pixel electrodes. For instance, the sidewall WL is spaced apart from each of the pixel electrodes PE1 and PE2 by about 3 micrometers or more when viewed in a plan view.

A sealant layer SL is disposed on the cover layer CVL. The sealant layer SL seals both end portions of the tunnel-shaped cavity TSC to seal the tunnel-shaped cavity TSC. That is, the tunnel-shaped cavity TSC is sealed by the color filter part, the first pixel electrode PE1, the common electrode CE, and the sealant layer SL, or by the color filter part, the second pixel electrode PE2, the common electrode CE, and the sealant layer SL.

In the display device according to the present exemplary embodiment, the common electrode and the reference line are disposed on the same layer, but spaced apart from each other. Thus, a short circuit between the common electrode and the reference line may be prevented, and no additional insulating layer used to insulate the common electrode and the reference line is required.

Hereinafter, a method of manufacturing the display device according to another exemplary embodiment will be described in detail with reference to FIGS. 6 and 7A to 7C.

The gate line GL, the storage line STL, the data line DL, and the thin film transistors TR1 to TR3 connected to the gate line GL, the storage line STL, the data line DL are formed on the base substrate BS. The gate line GL, the storage line STL, the data line DL, and the thin film transistors TR1 to TR3 are formed by a photolithography process.

Then, the first and second pixel electrodes PE1 and PE2 connected to the thin film transistors TR1 to TR3 and the reference line RL are formed. The first and second pixel electrodes PE1 and PE2 and the reference line RL are patterned by a photolithography process using one mask.

The sacrificial layer (not shown) is formed on the first and second pixel electrodes PE1 and PE2 and the reference line RL. The sacrificial layer is formed in the areas in which the first and second pixel electrodes PE1 and PE2 are formed and the areas in which portions of the reference line RL, which are respectively adjacent to the first and second pixel electrodes PE1 and PE2, are formed. The sacrificial layer is extended in the second direction D2.

The sacrificial layer is removed later to define the tunnel-shaped cavity TSC. The sacrificial layer is formed to have width and height corresponding to those of the tunnel-shaped cavity TSC in the area in which the image display part DSP is formed.

Then, the common electrode CE is formed on the sacrificial layer along the second direction D2 crossing the first direction D1.

The cover layer CVL is formed to cover the common electrode CE. The cover layer CVL is not formed between the first and second pixel electrodes PE1 and PE2 to expose a portion of the sacrificial layer.

After that, the sacrificial layer is removed by an etch process. The sacrificial layer is removed through a portion in which the cover layer CVL is not formed. The sacrificial layer is removed by a dry etch process using plasma or a wet etch process using etchant.

Then, the image display part DSP, e.g., the liquid crystal layer, is formed in the tunnel-shaped cavity. When the liquid crystal is provided around the tunnel-shaped cavity TSC, the liquid crystal moves into the tunnel-shaped cavity TSC by a capillary tube phenomenon because the liquid crystal is a fluid.

An alignment layer may be formed in the tunnel-shaped cavity TSC in accordance with a display mode of the display device according to the present exemplary embodiment.

Then, the liquid crystal is removed except for the liquid crystal provided in the tunnel-shaped cavity TSC and the sealant layer SL is formed to surround the tunnel-shaped cavity TSC. The sealant layer SL seals the openings of the tunnel-shaped cavity TSC through which the liquid crystal is injected.

As described above, the structure in which the common electrode is spaced apart from the reference line may be achieved without additional photolithography processes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display device comprising:
a substrate;
a cover layer disposed on the substrate and forming a tunnel-shaped cavity;
an image display part provided in the tunnel-shaped cavity; and
an electronic device configured to control the image display part, the electronic device comprising:
a pixel electrode;
a common electrode spaced apart from the pixel electrode and configured to form an electric field in the image display part in cooperation with the pixel electrode;
a plurality of thin film transistors configured to apply a voltage to the pixel electrode; and
a reference line connected to at least one of the plurality of thin film transistors,
wherein the reference line is configured to receive a reference voltage, and
wherein a portion of the common electrode and the reference line are disposed on the same layer, and the portion of the common electrode is spaced apart from the reference line.

2. The display device of claim 1,
wherein the pixel electrode comprises a first pixel electrode and a second pixel electrode, the first and second pixel electrodes are adjacent to each other with the gate line being interposed therebetween, and each of the first and second pixel electrodes comprises a trunk portion and a plurality of branch portions connected to the trunk portion and spaced apart from each other.

3. The display device of claim 1, wherein the plurality of thin film transistors comprise:
a first thin film transistor connected to the gate line, the data line, and the first pixel electrode;
a second thin film transistor connected to the gate line, the data line, and the second pixel electrode; and
a third thin film transistor connected to the gate line, a drain electrode of the second thin film transistor, and the reference line.

4. The display device of claim 1, wherein the electronic device further comprises:
a gate line disposed on the substrate; and
a data line crossing the gate line.

5. The display device of claim 4, wherein the reference line is overlapped with the data line.

6. The display device of claim 5, wherein the cover layer further forms a dummy space disposed at a side of the tunnel-shaped cavity and spaced apart from the tunnel-shaped cavity.

7. The display device of claim 6, wherein the cover layer comprises:
a sidewall portion protruded from an upper surface of the substrate; and
a cover portion connected to the sidewall portion to cover the tunnel-shaped cavity,
wherein the common electrode is disposed between the substrate and the cover layer along the sidewall portion and the cover portion.

8. The display device of claim 7, further comprising a black matrix disposed between the substrate and the image display part, wherein the black matrix is disposed to correspond to an area in which the sidewall portion and the dummy space are provided.

9. The display device of claim 7, wherein the dummy space is overlapped with the data line and extended in a direction in which the data line is extended.

10. The display device of claim 7, wherein the common electrode is configured to receive a voltage having a level different from a level of the reference voltage.

11. The display device of claim 7, wherein the reference line is disposed on the same layer as the pixel electrode.

12. The display device of claim 7, wherein the reference line comprises the same material as the pixel electrode.

13. The display device of claim 7, wherein the reference line is spaced apart from the sidewall portion by about 3 micrometers.

14. The display device of claim 7, wherein the sidewall portion is spaced apart from the pixel electrode by about 3 micrometers.

15. The display device of claim 7, wherein a portion of the reference line is disposed in the dummy space.

16. The display device of claim 15, further comprising a dummy liquid crystal layer disposed in the dummy space.

17. The display device of claim 15, further comprising a sacrificial layer disposed in the dummy space.

18. A display device comprising:
a substrate;
a cover layer disposed on the substrate and forming a tunnel-shaped cavity;
an image display part provided in the tunnel-shaped cavity; and
an electronic device configured to control the image display part, the electronic device comprising:
a pixel electrode;
a common electrode spaced apart from the pixel electrode and configured to receive a first voltage and to form an electric field in the image display part in cooperation with the pixel electrode;
a plurality of thin film transistors configured to apply a voltage to the pixel electrode; and
a reference line connected to at least one of the plurality of thin film transistors, the reference line being configured to receive a second voltage different from the first voltage,
wherein the reference line, the common electrode, and the pixel electrode are spaced apart from one another, and at least a portion of the reference line, at least a portion of the common electrode, and at least a portion of the pixel electrode are disposed directly on the same layer.

* * * * *